United States Patent

Mitzlaff

[11] Patent Number: 5,912,586
[45] Date of Patent: Jun. 15, 1999

[54] FEED FORWARD AMPLIFIER WITH DIGITAL INTERMODULATION CONTROL

[75] Inventor: James Edward Mitzlaff, Arlington Heights, Ill.

[73] Assignee: Motorola, Inc., Schaumburg, Ill.

[21] Appl. No.: 08/996,754

[22] Filed: Dec. 23, 1997

[51] Int. Cl.[6] ....................................................... H03F 1/26
[52] U.S. Cl. .......................................... 330/149; 330/151
[58] Field of Search ..................................... 330/151, 149, 330/52; 455/126

[56] References Cited

U.S. PATENT DOCUMENTS

| | | | |
|---|---|---|---|
| 4,361,892 | 11/1982 | Martin | 375/14 |
| 4,879,519 | 11/1989 | Myer | 330/149 |
| 5,077,531 | 12/1991 | Obermann et al. | 330/151 |
| 5,130,663 | 7/1992 | Tatterall, Jr. | 330/52 |
| 5,166,634 | 11/1992 | Narahashi et al. | 330/151 |
| 5,386,198 | 1/1995 | Ripstrand et al. | 330/52 |

Primary Examiner—Robert Pascal
Assistant Examiner—Khanh V. Nguyen

[57] ABSTRACT

A feed forward amplifier with digital intermodulation control (200) includes an up-converter (219), a feed forward amplifier (100), a down-converter (230), and a digital intermodulation controller (214). The up-converter (219) receives a first digital input (218) and generates an analog composite signal (140) and a reference frequency signal (221). The feed forward amplifier (100) receives the analog composite signal (140) and produces an amplified analog composite signal (147) and an amplified analog composite signal sample (126). The down-converter (230) mixes the amplified analog composite signal sample with the reference frequency signal in a mixer (216) to produce an adjusted amplified analog composite signal sample (128) which is then converted to a second digital (226) input via an analog-to-digital converter (215). A digital intermodulation controller receives first digital input and second digital input and subsequently generates a phase and gain adjuster input (224, 225) for adjusting the feed forward amplifier (100).

14 Claims, 4 Drawing Sheets

FEED FORWARD AMPLIFIER WITH DIGITAL INTERMODULATION CONTROL

FIELD OF THE INVENTION

The present invention relates generally to feed forward amplifiers and, in particular, to a method and apparatus for digitally controlling the gain and phase of an error signal in a feed forward amplifier.

BACKGROUND OF THE INVENTION

RF power amplifiers are used in a wide variety of communications and other electronic applications. These amplifiers are made up of one or more cascaded amplifier stages, each of which increases the level of the signal applied to the input of that stage by an amount known as a cascade gain. Ideally, the input-to-output transfer of each stage is linear; a perfect replica of the input signal, increased in amplitude, appears at the amplifier output. In reality, however, all RF power amplifiers have a degree of non-linearity in their transfer characteristic. This non-linearity results in the distortion of the output signal so that it is no longer a perfect replica of the input. This distortion produces spurious signal components known as intermodulation (IM) products. Intermodulation products are undesirable because the cause interference cross-talk, and other deleterious effects on the performance of a system employing RF power amplifiers. Accordingly, the prior art reflects various methods and devices designed to reduce the distortion produced during RF power amplifier operation. Two methods commonly suggested are predistortion and feed forward.

Predistortion utilizes an auxiliary distortion source which produces an auxiliary distortion signal similar to the distortion generated by a power amplifier. The auxiliary distortion signal is added to the power amplifier input in the correct gain and phase to promote cancellation of the distortion at the output of the power amplifier. This method requires matching the distortion characteristics of two dissimilar sources and hence limits the amount of correction which can be obtained.

Feed forward amplifier circuits are known in the art. Feed forward amplifier circuits utilize a feed forward technique in which a sample of the distortion generated in a power amplifier is coupled off, isolated, amplified, and recombined 180 degrees out of phase, in order to cancel the remaining distortion in the output signal. In general, feed forward amplifier circuits separate out distortion and intermodulation components generated by a power amplifier in order to create an error signal. The error signal is then added to the power amplifier's output with a gain, a phase shift, and delay. The gain, phase shift, and delay are adjusted for maximum cancellation of the intermodulation and distortion generated by the power amplifier, in an attempt to produce an amplified output signal which is free of distortion. In essence, the error components which are created by the power amplifier are subsequently subtracted out of the amplified signal. The amount of distortion reduction available using feed forward technology is limited by the accuracy of gain and phase adjustments of the error signal. Prior art feed forward amplifiers have attempted to increase the accuracy of the gain and phase adjustments by injecting a test signal, or pilot, into the main signal. The test signal is then utilized to adjust the gain and phase of the error cancellation signal. The problem with utilizing a pilot tone for controlling the gain and phase of the error signal is that the addition of a pilot tone generator adds appreciable cost, board space, and isolation requirements to any feed forward amplifier.

Typical prior art feed forward amplifiers implement distortion minimization circuits which provide continuous, and substantially accurate, gain and phase adjustments. Feed forward amplifier accuracy over a wide range of frequencies and amplitudes results from utilizing both carrier and intermodulation cancellation, controlled by the detection of the total power of the intermodulation distortion via an intermodulation controller, rather than by an injected pilot tone. Although this circuitry provides a substantial improvement over other prior art feed forward circuits, it utilizes bulky RF hardware in its intermodulation controller. Such bulky RF hardware may include delay lines and couplers commonly associated with analog applications. In applications which require digital implementation due to smaller space availability and tighter specification tolerance, utilization of a digital signal processor (DSP) is desirable. In addition, an intermodulation controller implemented via a DSP would also result in a lower part count and hence reduced cost. Also, utilizing a digitally implemented IM controller in place of the prior art analog implemented IM controller affords more accurate control of the gain and phase adjustments to the error signal due to improved carrier cancellation and a more accurate estimate of the total power of the intermodulation distortion.

Therefore a need exists for a method and apparatus to digitally control the gain and phase of an error signal in a feed forward amplifier circuit which overcomes the prior art problems.

DETAILED DESCRIPTION OF THE DRAWINGS

Stated generally, a feed forward amplifier with digital intermodulation control includes an up-converter, a feed forward amplifier, a down-converter, and a digital intermodulation controller. The up-converter receives a first digital input and generates an analog composite signal and a reference frequency signal. The feed forward amplifier receives the analog composite signal and produces an amplified analog composite signal and an amplified analog composite signal sample. The down-converter mixes the amplified analog composite signal sample in a mixer with the reference frequency signal to produce an adjusted amplified analog composite signal sample and then converts an adjusted amplified analog composite signal sample to a second digital input via an analog-to-digital converter. A digital intermodulation controller receives first digital input and second digital input 226 and generates a phase and gain adjuster input for adjusting the feed forward amplifier.

The present invention encompasses a method for providing digital intermodulation control to a feed forward amplifier, the feed forward amplifier including an amplifier signal path and a feed forward signal path. The method includes the steps of receiving a first digital input at an up-converter and a digital IM controller, converting the first digital input to an analog composite signal in the up-converter, and amplifying the analog composite signal in the amplifier signal path to produce an amplified analog signal composed of carrier and error components. The method further includes gain and phase adjusting a sample of the analog composite signal in a first gain and phase adjuster to form a feed forward signal and then combining the feed forward signal with a sample of the amplified analog signal sample in a directional coupler to form an error signal. Additionally, the method includes gain and phase adjusting the error signal in a second gain and phase adjuster to form an adjusted error signal, amplifying the adjusted error signal to produce an amplified error signal composed of error components, and subtracting the amplified error signal from the amplified analog signal in a second directional coupler to produce an amplified analog composite signal. Finally, the method includes converting a sample of the amplified analog composite signal in a down-converter to form a second digital input, receiving at a digital IM controller the first and second digital inputs, and generating, by the digital IM controller, a gain adjuster input and phase adjuster input for receipt by the second gain and phase adjuster based on a difference between the first and second digital inputs.

The present invention also describes a digital IM controller for generating a phase adjuster input and a gain adjuster input to a feed forward amplifier. The digital IM controller includes an adaptive FIR filter for receiving and adjusting an amplitude and frequency response of a first digital input in response to a plurality of multiple tap inputs to form an aligned first digital signal. The digital IM controller further includes a subtractor for receiving a second digital input and subtracting the aligned first digital signal from the second digital input to form a subtractor output. The subtractor output is composed of residual error components. In addition, the digital IM controller further includes a carrier cancellation controller for correlating the first digital input with the subtractor output to adjust the plurality of multiple tap inputs and to provide an indicator signal, a total power detector for converting the power level of the subtractor output to a digital value, and finally an intermodulation cancellation controller for receiving the indicator signal, comparing the digital value to a previous digital value generated by the total power detector to form a comparison value, and generating a phase and gain adjuster input in response to the comparison value.

The present invention additionally encompasses a method for generating a phase adjuster input and a gain adjuster input to a feed forward amplifier. The method includes the steps of receiving, at an adaptive FIR filter, a first digital input composed of a plurality of summed ideal digital signals, adjusting, by the adaptive FIR filter, an amplitude and frequency response of the first digital input in response to a plurality of multiple tap inputs to form an aligned first digital signal. The method further includes receiving, at a subtractor, the aligned first digital signal and a second digital input composed of a plurality of summed real digital signals including error components, subtracting, in the subtractor, the aligned first digital signal from the second digital input to form a subtractor output composed of a plurality of residual error components. Additionally, the method includes correlating, in a carrier cancellation controller, the first digital input with the subtractor output to adjust the plurality of multiple tap inputs and to provide an indicator signal to an intermodulation cancellation controller, converting, by a total power detector (304), a power of the subtractor output to a digital value. Finally, the method includes comparing, by the intermodulation cancellation controller, the digital value to a previous digital value generated by the total power detector to form a comparison value, and generating, by the intermodulation cancellation controller, the phase and gain adjuster input in response to the comparison value, controlling a gain and a phase of an error signal in a feed forward amplifier.

Figure 1:
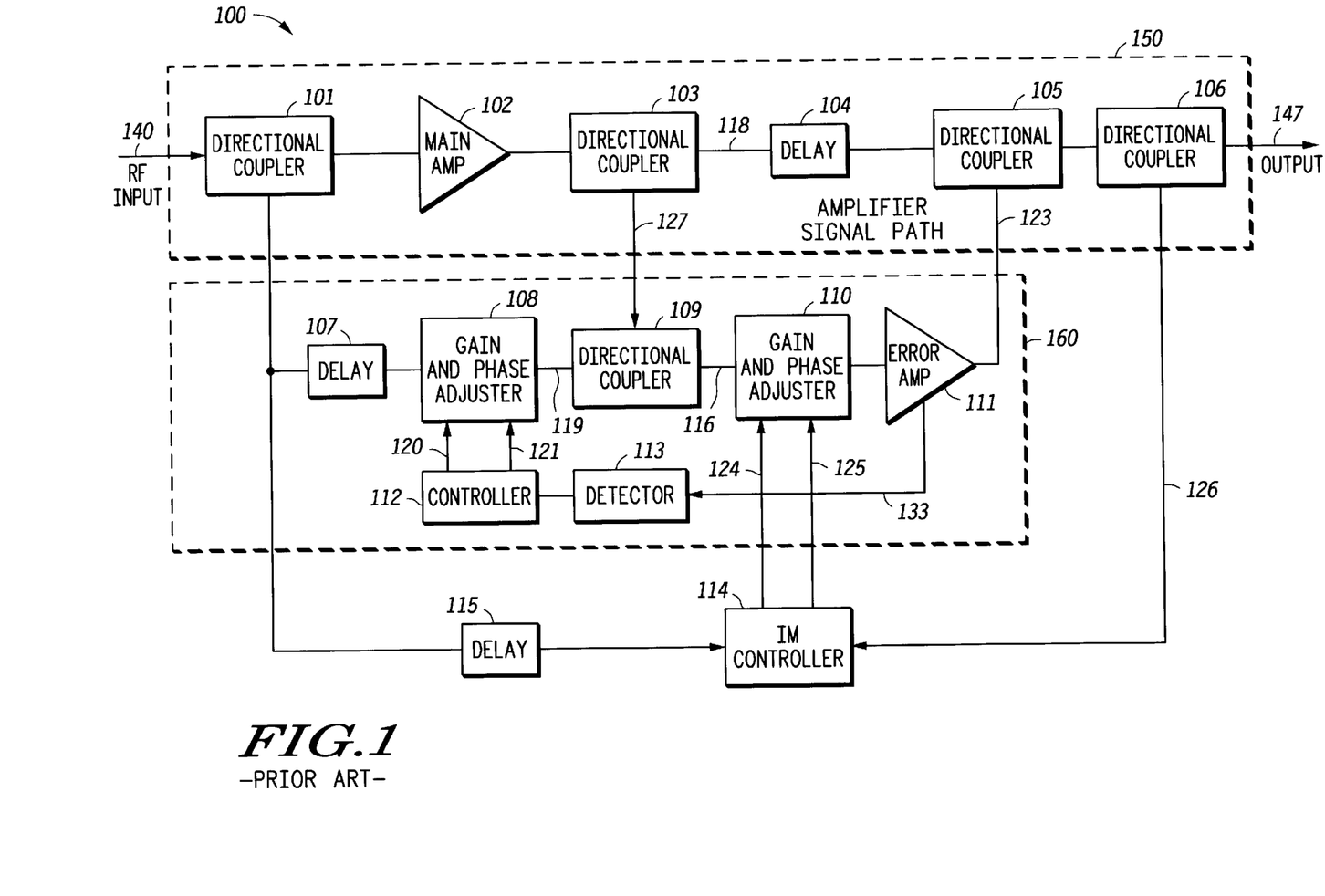
FIG. 1 is a prior-art feed forward amplifier.

Referring to FIG. 1, there is shown a feed forward amplifier circuit 100 in block diagram form. An analog composite signal 140, which may include more than one RF carrier, is routed by a directional coupler 101, causing analog composite signal 140 to be directed to two signal paths. The two signal paths, an amplifier signal path 150 and a feed forward signal path 160, generally comprise well known components of a feed forward amplifier. In amplifier signal path 150, analog composite signal 140 is amplified in a main amplifier 102 and directed to main amplifier path output as an amplified analog composite signal 147 through a directional coupler 103, a delay 104, and directional couplers 105 and 106. As previously mentioned, the non-linearity of main amplifier 102 may result in distortion and intermodulation, or error components being introduced into the signal appearing at the input of directional coupler 103 Accordingly, an amplified analog signal 118 appearing at the output of directional coupler 103 will be characterized by carrier components and error components. The distortion generated by main amplifier 102 is the source of these error components which are subsequently canceled by the feed forward signal path using an output from the feed forward signal path 160.

The other signal path, feed forward signal path 160, functions to recreate the error components introduced by amplifier signal path 150. In this effort, a sample of analog composite signal 140 coupled off by directional coupler 101 is delayed in a delay circuit 107, then gain and phase adjusted in a first gain and phase adjuster 108 without appreciable distortion being introduced. The time delay of a delay circuit 107 is set to compensate for the signal delay introduced by main amplifier 102 and directional coupler 103.

At the output of main amplifier 102, a sample of the distorted amplified analog signal herein referred to as amplified analog signal sample 127 (having an error component) is coupled down to directional coupler 109 via directional coupler 103 where it is recombined 180 degrees out of phase with a feed forward signal 119. If the amplitude and the phase of feed forward signal 119 is properly adjusted by first gain and phase adjuster 108, the carrier components of amplified analog signal sample 127 will cancel the carrier components of feed forward signal 119, thereby isolating the distortion. The resulting signal, generally designated as an error signal 116 will be characterized by error components. Accordingly, error signal 116 appearing at the output of directional coupler 109 is representative of the distortion and intermodulation components introduced by main amplifier 102. This process is often referred to as carrier cancellation.

Thereafter, the amplitude and phase of error signal 116 is modified by a second gain and phase adjuster 110, amplified in an error amplifier 111, resulting in an amplified error signal 123. In addition, error amplifier 111 produces a error signal sample 133 suitable for receipt by a detector 113 (discussed below). Amplified error signal 123 is routed to a directional coupler 105 where it is subtracted from amplified analog signal 118 via directional coupler 105 and delay circuit 104. The time delay of delay circuit 104 is set to compensate for the signal delay introduced by directional coupler 109, second phase and gain adjuster 110, and error amplifier 111. If the amplitude and the phase of error signal 116 is properly adjusted by second gain and phase adjuster 110, the error components of the main signal path will be canceled, resulting in a "clean" amplified analog composite signal 147 appearing at the main amplifier path output.

In order to achieve maximum error component removal, first gain and phase adjuster 108 must be controlled to produce a clean error signal 116, i.e. one that is substantially representative of the distortion created by main amplifier 102. A feedback circuit employing error amplifier 111, detector 113, controller 112 and first phase and gain adjuster 108 is utilized to reduce the carrier-to-distortion ratio of error signal 116. The feedback circuit monitors the performance of the carrier cancellation and then provides dynamic adjustment via controller 112 to first phase and gain adjuster 108 in order to substantially assure that error signal 116 is representative of the error components introduced by main amplifier 102.

During operation, error signal sample 133 is detected by detector 113. Detector 113 may be a DC current detector that detects DC current drawn by error amplifier 111. The current drawn by error amplifier 111 is a function of the amount of radio frequency (RF) energy entering the error amplifier 111 and is proportional to the total carrier energy within the error signal's passband. The greater the RF energy entering error amplifier 111, the larger the amount of current drawn by that amplifier during operation. When the detected DC current indicates sufficient carrier energy within error signal sample 133, detector 113 provides an indication to controller 112. In response to the indication, controller 112 modifies the amplitude and phase parameters of gain and phase adjuster 108 via control lines 120 and 121, thereby adjusting the amplitude and phase of signals in the feed forward signal path to improve carrier cancellation at the output of directional coupler 109. Similarly, detector 113 may be implemented as an RF voltage detector that detects levels of RF voltage sampled from the input or output of error amplifier 111.

An intermodulation cancellation circuit employing error amplifier 111, directional couplers 105 and 106, an IM controller 114, and second gain and phase adjuster 110 is also utilized to provide maximum distortion cancellation by monitoring the intermodulation performance of the feed forward circuit. The intermodulation circuit also provides dynamic control of second gain and phase adjuster 110 via control lines 124 and 125 in response thereto.

During operation, the amplitude and phase of error signal 116 is modified by second gain and phase adjuster 110, amplified by error amplifier 111, and routed to directional coupler 105 where it is subtracted from amplified analog signal 118 via directional coupler 105, in order to remove error components from amplified analog composite signal 147. To assure maximum distortion cancellation, a sample of amplified analog composite signal 147 herein designated as amplified analog composite signal sample 126 is coupled down from directional coupler 106 and routed to IM controller 114. In addition, a portion of analog composite signal 140 is delayed by a delay circuit 115, and then routed to IM controller 114. If the amplitude and phase of error signal 116 is properly adjusted, IM controller 114 will detect no distortion in amplified analog composite signal sample 126. If amplified analog composite signal sample 126 has error components of sufficient energy, however, IM controller 114 will modify the amplitude and phase parameters of second gain and phase adjuster 110, via control lines 124 and 125, thereby adjusting the amplitude and phase of amplified error signal 123 to drive the distortion of amplified analog composite signal sample 126 to a minimum.

As described, feed forward amplifier circuit 100 provides improvement in the phase and gain adjustment of an error signal in a feed forward signal path. Although the improvement is substantial, it does not fully address cancellation of possible residual carrier components appearing at the input of IM controller 114. The possible residual carrier components resulting from the distorted frequency response of main amplifier 102 may interfere with the ability of IM controller 114 to accurately detect residual error components. The compromised ability of IM controller 114 to detect residual error components may then result in a degradation of control to phase and gain adjustments of the error signal in a feed forward signal path.

Figure 2:
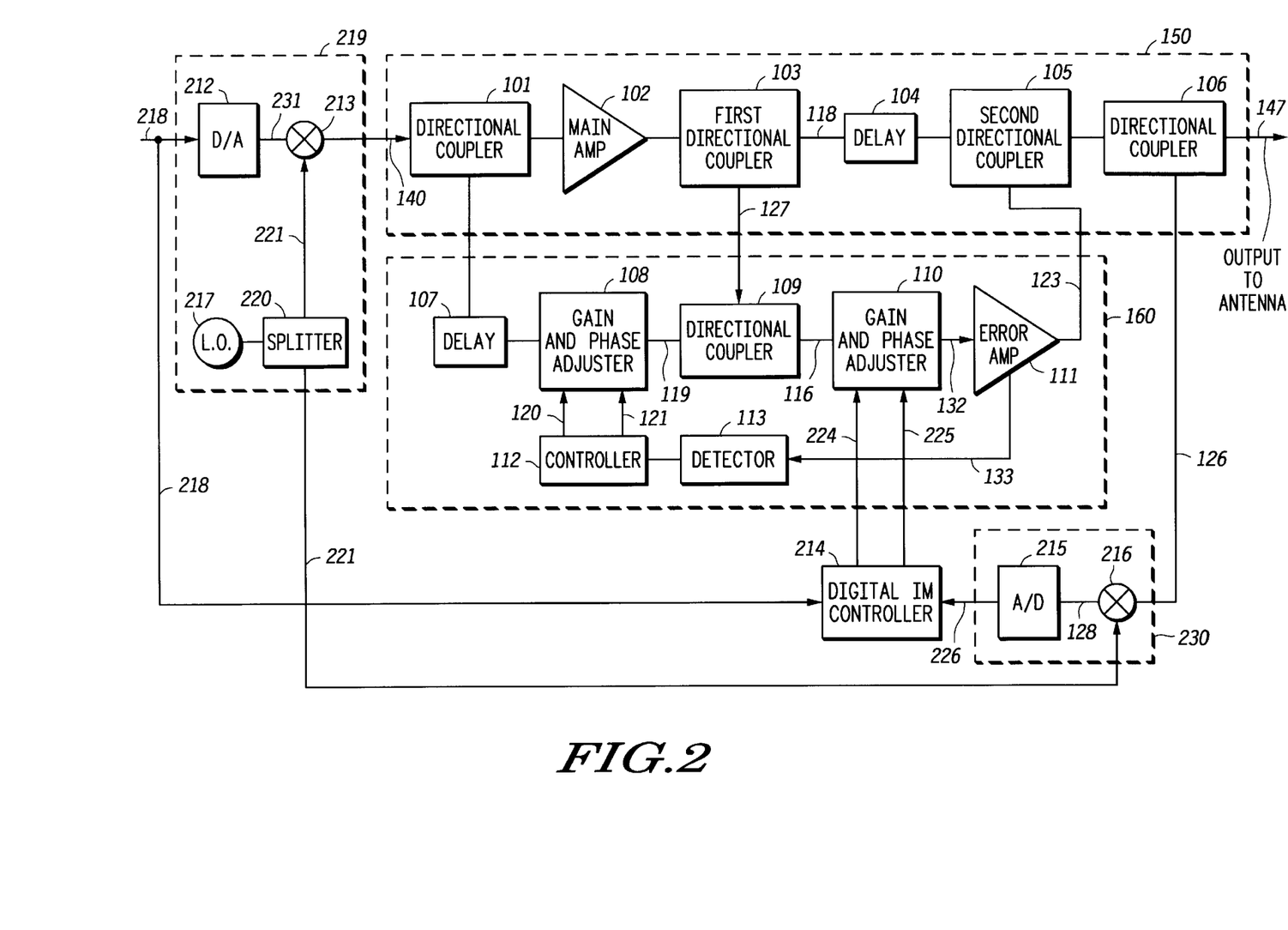
FIG. 2 is a block diagram of feed forward amplifier in accordance with the preferred embodiment of the present invention.

Referring to FIG. 2, there is shown in a block diagram, a preferred embodiment of the feed forward amplifier circuit, according to the present invention. Similar to the feed forward amplifier depicted in FIG. 1, the preferred embodiment of the feed forward amplifier circuit includes amplifier signal path 150 and feed forward signal path 160. Whenever possible, like components in each path are made from the same material, and preferably on the same board in a single board amplifier.

As is evident, FIG. 2 additionally comprises an up-converter 219, and a down-converter 230. Further, a digital signal appearing at the input of up-converter 219 provides a first digital input 218 to IM controller 214. First digital input 218 is representative of a plurality of summed ideal digital signals which are to be subsequently shifted via up-converter 219 to a higher frequency, amplified and combined with the output from feed forward signal path 160, and transmitted at the main amplifier path output. In the preferred embodiment, first digital input 218 is provided by a transmitter combiner card (not shown), but may be provided by any suitable source. As is also evident, upon receiving an amplified analog composite signal sample 126 from directional coupler 106, down-converter 230 provides a second digital input 226 to IM controller 214. Down-converter 230 includes an analog-to-digital converter 215 and a first mixer 216. First mixer 216 operates to down-shift the frequency of amplified analog composite signal sample 126 to produce an adjusted composite analog signal sample 128 such that its frequency is suitable for input to digital IM controller 214. Further, analog-to-digital converter 215 converts adjusted composite analog signal sample 128 to a small amplitude digital signal stream appearing as second digital input 226 to digital IM controller 214. Second digital input 226 is representative of a plurality of summed real digital signals resulting from a low power sample of amplified analog composite signal 147 appearing at the main amplifier path output.

Additionally, first digital input 218 is converted to an analog signal and frequency shifted by up-converter 219. Up-converter 219 includes a digital-to-analog converter 212 which converts first digital input 218 to an analog signal 231, a second mixer 213, a splitter 220, and a local oscillator 217. Local oscillator 217 generates a reference frequency signal 221, which when mixed via second mixer 213 with analog signal 231, produces an analog composite input signal 140 suitable for receipt by main amplifier 102. In addition to providing reference frequency signal 221 to second mixer 213, splitter 220 provides reference frequency signal 221 to first mixer 216. This ensures that second digital input 226 is at the same frequency as first digital input 218 as is required for proper functioning of digital IM controller 214.

As discussed in connection with FIG. 2., first digital input 218 represents a plurality of summed ideal digital signals which have not been amplified by main amplifier 102 and therefore are "deal" in that it only comprises carrier components. Conversely, second digital input 226 represents a plurality of digital signals which have been converted to an analog signal and amplified by main amplifier 102, resulting in the addition of error components. Theoretically, all of the error components are then removed as a consequence of feed forward amplifier operation. and a clean distortionless (i.e. no error components), amplified output signal is produced. Although the majority of the error components are removed, in reality, a "real" analog signal including carrier components and residual error components is produced at the output of directional coupler 105. According to a preferred embodiment of the present invention, reduction of residual error components is accomplished in the digital domain through the use of a digitally enabled IM controller such as digital IM controller 214. The resulting gain and phase manipulation of error signal 116 via a gain adjuster input 224 and a phase adjuster input 225 to second gain and phase adjuster 110 is accomplished as a result of a measure of the difference between first digital signal 218 and second digital signal 226 by digital IM controller 214 (discussed below).

Figure 3:
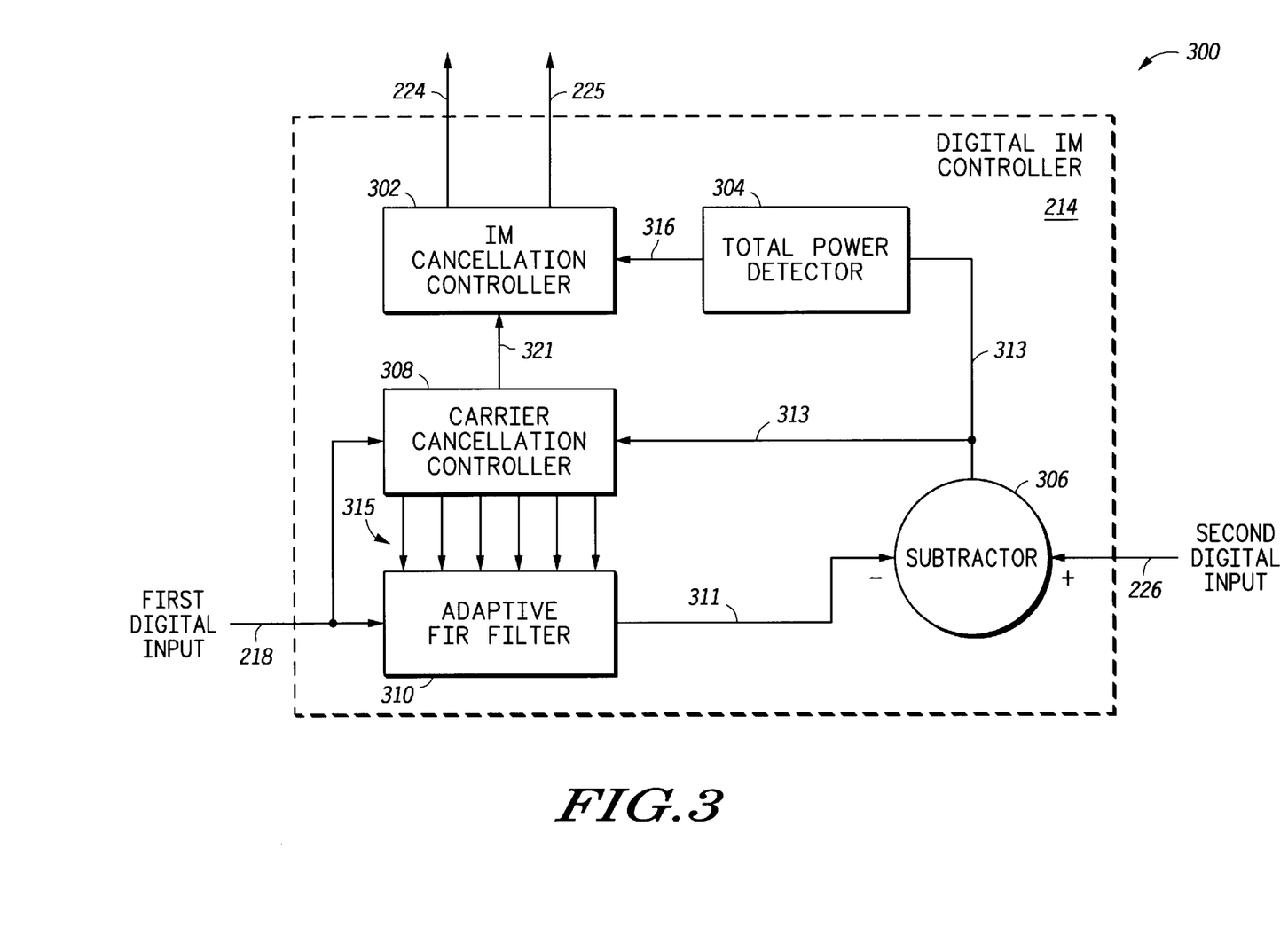
FIG. 3 is a block diagram of the digital IM controller illustrated in FIG. 2, in accordance with the preferred embodiment of the present invention.

Digital IM controller 214 is constructed as shown in FIG. 3. Digital IM controller 214 includes an adaptive finite impulse response (FIR) filter 310 for receiving first digital input 218, a carrier cancellation controller 308, a subtractor 306, a total power detector 304 and an IM cancellation controller 302 for providing gain and phase adjuster inputs (224, 225) to second gain and phase adjuster 110.

Adaptive FIR filter 310 operates to align first digital input 218 with second digital input 226, the operation and construction of adaptive filters being well known in the art. The alignment is accomplished via delaying and then adjusting the amplitude and frequency response of first digital signal 218 based on multiple tap inputs 315 (discussed below) received from carrier cancellation controller 308. A resulting aligned first digital signal 311 from adaptive FIR filter 310 is subtracted from second digital input 226 in subtractor 306, yielding a subtractor output 313.

As was previously mentioned, aligned first digital input 311 results from a plurality of digital signals which include carrier components while second digital input 226 represents a plurality of digital signals which include both carrier components and residual error components. Accordingly, subtractor 306 provides subtractor output 313 representative of residual error components as well as possible residual carrier components.

Carrier cancellation controller 308 operates to provide adjustments to adaptive FIR filter 310 through the use of multiple tap inputs 315. Carrier cancellation controller 308 receives two inputs, first digital input 218 and subtractor output 313. Adjustments via multiple tap inputs 315 to adaptive FIR filter 310 are accomplished by correlating first digital input 218 with subtractor output 313. Carrier cancellation circuit 308 then adjusts multiple tap inputs 315 so as to minimize this correlation at each of the delay values associated with the taps in adaptive filter 310. This iterative feedback technique removes subsequent residual carrier components appearing in subtractor output 313 as aligned first digital input 311 and second digital signal 226 become substantially identical in frequency response gain, phase and delay. In addition, carrier cancellation circuit 308, upon noting that correlation calculations used to adjust multiple tap inputs 315 yield values that are below some predetermined threshold, provides an indicator signal 321 to IM cancellation controller 302 (discussed below). Carrier cancellation controller 308 may be implemented via a digital signal processor or custom integrated circuit.

In addition to providing input to carrier cancellation controller 308, subtractor output 313 provides input to total power detector 304. Subtractor output 313 appears at the input of total power detector 304 as a digital distortion signal representative of the residual error components present in second digital input 226. Total power detector 304 is a digital detection envelope function provided by a multiplier to multiply subtractor output 313 by its complex conjugate, and a low pass digital filter. Total power detector 304 provides an averaging function, which yields a digital value 316, representative of the power of the residual error components present in second digital input 226. Digital value 316 may be formed using a number of methods. Such methods may include summing a predefined number of subtractor outputs 313, or replacing the oldest previous subtractor output on a stack of buffered outputs with the current subtractor output and then summing the buffered outputs. Next, digital value 316 is compared with a previous digital value previously generated by total power detector 304 by IM cancellation controller 302, thus forming a comparison value. Based on the comparison value, gain adjuster input 224 and phase adjuster input 225 are modified.

IM cancellation controller 302 remains idle until it receives an indicator signal 321 from the carrier cancellation controller 308 indicating that the carrier cancellation process in carrier cancellation controller 308, has converged. Carrier cancellation controller 308 is said to have converged when all the correlation calculations used to adjust multiple tap inputs 315 yield values that are below a predetermined threshold. Utilization of indicator signal 321 prevents IM cancellation controller 302 from making improper adjustments during start up, during which time the output of total power detector 304 is varying dramatically due to the action of carrier cancellation controller 308.

IM cancellation controller 302 operates as follows. Upon receipt of a suitable indicator signal 321 from carrier cancellation controller 308, IM cancellation controller 302 begins its IM cancellation process. First, digital value 316 is measured after waiting for a period of time at least equal to the averaging interval used in total power detector 304. A small change, dV, is then temporarily made to gain adjuster input 224. After again waiting for the averaging process in total power detector 304 to complete, digital value 316 is re-measured, forming a new level. If this new level is significantly lower than the previous level, then gain adjuster input 224 is changed by $Q*dV$, where Q is some number between 0 and 1. If this new level is significantly higher than the previous level, then gain adjuster input 224 is changed by $-Q*dV$. If this new level is not significantly different from the previous level, then gain adjuster input 224 is not changed. The IM cancellation process is then repeated using phase adjuster input 225 instead of gain adjuster input 224. The entire cycle of adjusting gain adjuster input 224 and phase adjuster input 225 to second gain and phase adjuster 110 is then repeated continuously. The adjusting subsequently affects amplified analog composite signal sample 126 and therefor second digital input 226.

Figure 4:
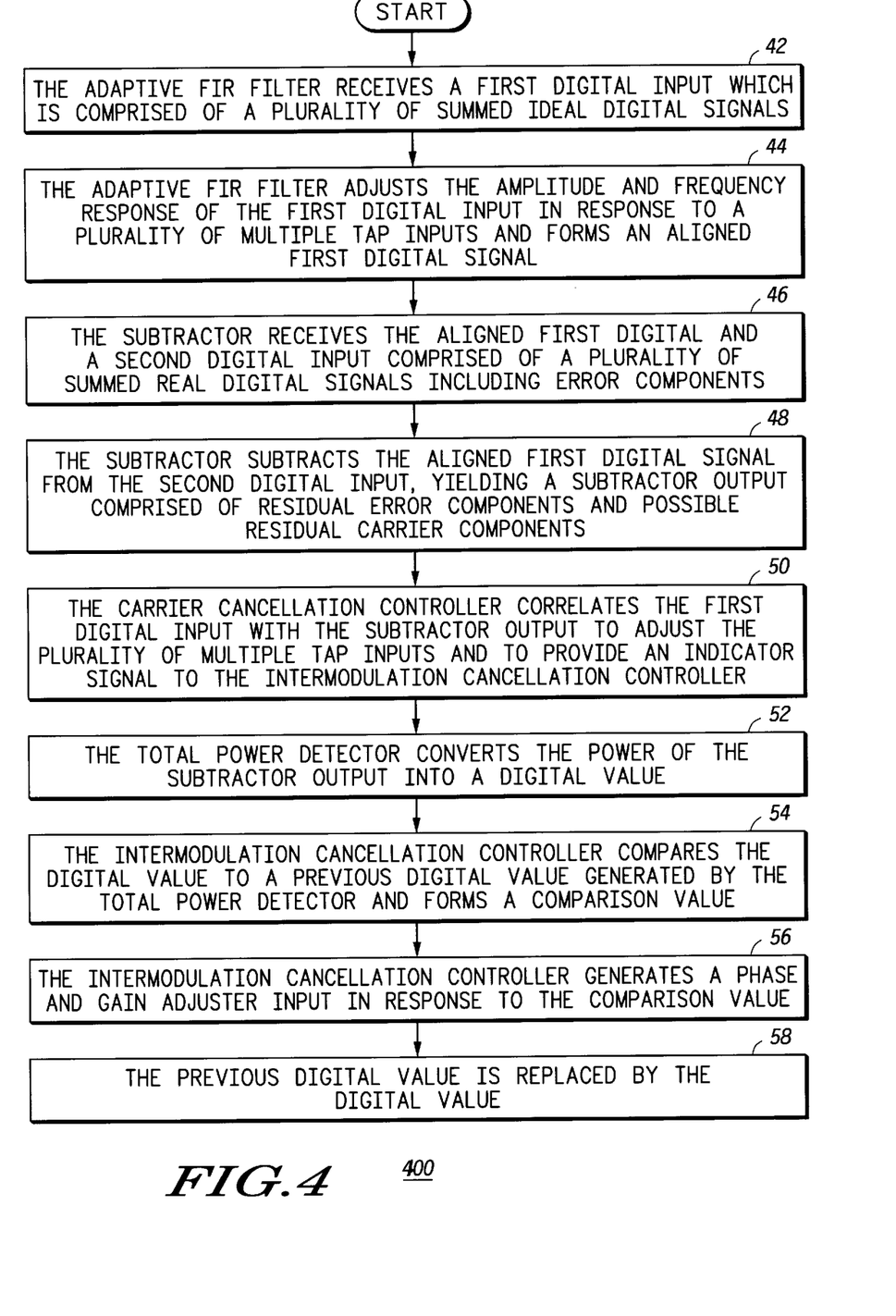
FIG. 4 is a flow chart illustrating those steps necessary for generating a phase adjuster input and a gain adjuster input to a feed forward amplifier by the digital IM controller of FIG. 3 in accordance with the preferred embodiment of the present invention.

FIG. 4 is a flow chart illustrating those steps necessary for generating a phase adjuster input and a gain adjuster input 224, 225 to a feed forward amplifier 100 by digital IM controller 214 of FIG. 3 in accordance with the preferred embodiment of the present invention. The logic flow starts at step 42 where adaptive FIR filter 310 receives first digital input 218 which is comprised of a plurality of summed ideal digital signals. Adaptive FIR filter 310 then adjusts the amplitude and frequency response of first digital input 218 in response to a plurality of multiple tap inputs 315 and forms aligned first digital signal 311, at step 44. Next at step 46, subtractor 306 receives aligned first digital signal 311 and second digital input 226. Second digital input 226 is comprised of a plurality of summed real digital signals including error components. Subtractor 306 subtracts aligned first digital signal 311 from second digital input 226, yielding a subtractor output 313, at step 48. Subtractor output 313 is comprised of residual error components and possible residual carrier components. Next, at step 50, carrier cancellation controller 308 correlates first digital input 218 with subtractor output 313, generating indicator signal 321 for receipt by intermodulation cancellation controller 302. In addition, the results of the correlation provide an adjustment to multiple tap inputs 315. Subtractor output 313 also provides the input to total power detector 304 which converts the power of the subtractor output 313 into digital value 316, at step 52. Next, at block 54, digital value 316 is received by intermodulation cancellation controller 302 which then compares digital value 316 to the previous digital value generated by total power detector 304. The comparison yields a comparison value. At step 56, in response to the comparison value, intermodulation cancellation controller 302 generates gain adjuster input 224 and phase adjuster input 225 for receipt by feed forward amplifier 100. Finally at step 58, the previous digital value used in step 54 is replaced by digital value 316 and the flow passes back to step 52. Subsequently, a new digital value is generated, replacing digital value 316. Steps 52, 54, and 56 are repeated continuously in order to keep gain adjuster input 224 and phase adjuster input 225 set at the levels required to minimize the error components in amplified analog composite signal 147.

While the invention has been particularly shown and described with reference to a particular embodiment, it will be understood by those skilled in the art that various changes in form and details may be made therein without departing from the spirit and scope of the invention.

What is claimed is:

1. A feed forward amplifier with digital intermodulation control comprising:
   an up-converter having a first digital input and outputting an analog composite signal and a reference frequency signal;
   a feed forward amplifier for receiving analog composite signal and outputting an amplified analog composite signal and an amplified analog composite signal sample;
   a down-converter for receiving the amplified analog composite signal sample and outputting a second digital input; and
   a digital intermodulation controller having as inputs first digital input and second digital input and outputting a phase and gain adjuster input for adjusting the feed forward amplifier.

2. The feed forward amplifier with digital intermodulation control of claim 1 wherein the up-converter comprises:
   a digital-to-analog converter for converting first digital input signals to an analog signal;
   a first mixer for adjusting the frequency of analog signal in response to the reference frequency signal and outputting the analog composite signal; and
   a local oscillator coupled to a splitter, the splitter providing the reference frequency signal to first mixer and a second mixer.

3. The feed forward amplifier with digital intermodulation control of claim 1, wherein the feed forward amplifier further comprises an amplifier signal path and a feed forward signal path.

4. The feed forward amplifier with digital intermodulation control of claim 3, wherein the amplifier signal path comprises:
   a main amplifier for amplifying the analog composite signal to form an amplified analog signal comprising a plurality of carrier and error components; and
   a first directional coupler for coupling an amplified analog signal sample to the feed forward signal path.

5. The feed forward amplifier with digital intermodulation control of claim 4, wherein the feed forward signal path comprises:
   a first gain and phase adjuster for adjusting a phase and gain of analog composite signal in response to a controller to form a feed forward signal;
   a directional coupler for combining the feed forward signal with the amplified analog signal sample to form an error signal;
   a second gain and phase adjuster for adjusting the error signal in response to the phase and gain adjuster input to form an adjusted error signal; and
   an error amplifier for amplifying the adjusted error signal to form an amplified error signal comprising a plurality of amplified error components.

6. The feed forward amplifier with digital intermodulation control of claim 5, wherein the amplifier signal path further comprises a delay and second directional coupler for subtracting the amplified error signal from the amplified analog signal to form the amplified analog composite signal.

7. The feed forward amplifier with digital intermodulation control of claim 1, wherein the down-converter comprises:
   a second mixer for mixing the reference frequency signal with the amplified analog composite signal sample to produce an adjusted composite analog signal sample; and
   an analog-to-digital converter for converting the adjusted composite analog signal sample to a second digital input.

8. The feed forward amplifier with digital intermodulation control of claim 1, wherein the digital IM controller comprises:
   an adaptive FIR filter responsive to a plurality of multiple tap inputs, the adaptive FIR filter adjusting an amplitude and frequency response of the first digital input to form an aligned first digital signal;
   a subtractor responsive to the aligned first digital signal and the second digital input, the subtractor producing a subtractor output representative of residual error components;
   a carrier cancellation controller responsive to a correlation of the first digital input with the subtractor output to adjust the plurality of tap inputs, the carrier cancellation controller providing an indicator signal;
   a total power detector responsive to the subtractor output, the total power detector converting a power level of the subtractor output to a digital representation to form a digital value; and
   an intermodulation cancellation controller responsive to the indicator signal and the digital value, the intermodulation cancellation controller
   comparing the digital value to a previous digital value generated by the total power detector to form a comparison value, and generating the phase and gain adjuster input based on the comparison value.

9. A method for providing digital intermodulation control to a feed forward amplifier, the feed forward amplifier including an amplifier signal path and a feed forward signal path, the method comprising the steps of:

receiving a first digital input at an up-converter and a digital IM controller;

converting the first digital input to an analog composite signal in the up-converter;

amplifying the analog composite signal in the amplifier signal path to produce an amplified analog signal comprised of a plurality of carrier and error components;

gain and phase adjusting a sample of the analog composite signal in a first gain and phase adjuster of the feed forward signal path to form a feed forward signal;

combining the feed forward signal with a sample of the amplified analog signal in a directional coupler of the feed forward signal path to form an error signal;

gain and phase adjusting the error signal in a second gain and phase adjuster of the feed forward signal path to form an adjusted error signal;

amplifying the adjusted error signal to produce an amplified error signal comprised of a plurality of error components;

subtracting the amplified error signal from the amplified analog signal in a second directional coupler of the amplifier signal path to produce an amplified analog composite signal;

converting a sample of the amplified analog composite signal in a down-converter to form a second digital input;

receiving at a digital IM controller the first and second digital inputs; and generating, by the digital IM controller, a gain adjuster input and a phase adjuster input for receipt by the second gain and phase adjuster based on a difference between the first and second digital inputs.

10. The method according to claim 9, wherein the step of gain and phase adjusting a sample of the analog composite signal is controlled by a controller.

11. The method according to claim 9, wherein the amplified analog signal sample is coupled-down to the directional coupler by a first directional coupler of the amplifier signal path.

12. The method according to claim 9, wherein the step of gain and phase adjusting the error signal is controlled by the gain adjuster input and the phase adjuster input generated by the IM controller.

13. The method according to claim 9 wherein, prior to the step of subtracting, a delay is introduced to the amplified analog signal by a delay circuit of the amplifier signal path.

14. The method according to claim 9, wherein the step of converting the sample of the amplified analog composite signal further comprises:

mixing the reference frequency signal with the sample of the amplified analog composite signal in a mixer, forming an adjusted composite analog signal sample; and converting the adjusted composite analog signal sample to the second digital input in an analog-to-digital converter.

* * * * *